United States Patent [19]

Tazawa et al.

[11] Patent Number: 4,786,579
[45] Date of Patent: Nov. 22, 1988

[54] HEAT-RESISTANT PHOTOSENSITIVE RESIN COMPOSITION

[75] Inventors: Kenji Tazawa, Samukawa; Akihiko Saito, Yokohama, both of Japan

[73] Assignee: Tokyo Ohka Kogyo Co., Ltd., Kanagawa, Japan

[21] Appl. No.: 38,124

[22] Filed: Apr. 14, 1987

[30] Foreign Application Priority Data

Apr. 28, 1986 [JP] Japan ................................. 61-96933

[51] Int. Cl.4 .......................... G03C 1/68; G03C 5/16
[52] U.S. Cl. .................................. 430/280; 430/286; 430/287; 522/101; 522/102; 522/103; 522/33; 522/46; 522/49; 522/43; 522/68
[58] Field of Search ..................... 430/280, 286, 287; 522/101, 102, 103, 33, 46, 49, 43, 68

[56] References Cited

U.S. PATENT DOCUMENTS 4,025,348 5/1977 Tsukada et al. .................. 96/115 R
4,390,615 6/1983 Courtney et al. ............... 430/280 X
4,479,983 10/1984 Appelt et al. .................... 522/103 X

FOREIGN PATENT DOCUMENTS 49-47484 8/1974 Japan ................................. 430/280
58-199341 11/1983 Japan .
60-208377 10/1985 Japan ................................. 522/102
61-59447 3/1986 Japan ................................. 430/280

Primary Examiner—Paul R. Michl
Assistant Examiner—Cynthia Hamilton
Attorney, Agent, or Firm—Armstrong, Nikaido, Marmelstein & Kubovcik

[57] ABSTRACT

The inventive photosensitive resin composition has excellent heat resistance, adhesiveness to substrate surface and photosensitivity and suitable as a material for solder resist or plating resist on printed circuit boards. The resin composition comprises, in addition to a photopolymerization initiator and curing agent for epoxy resins, a resinous ingredient composed of a diallyl phthalate resin, a first esterified resin as a reaction product of a cresol novolac type epoxy resin and 0.2–0.8 mole per mole of epoxy groups of an ethylenically unsaturated carboxylic acid and a second esterified resin as a reaction product of a phenol and/or cresol novolac type epoxy resins and 0.9–1.1 moles per mole of epoxy resins of an ethylenically unsaturated carboxylic acid in a limited proportion.

8 Claims, No Drawings

HEAT-RESISTANT PHOTOSENSITIVE RESIN COMPOSITION

BACKGROUND OF THE INVENTION

The present invention is a photosensitive resin composition, more particularly, a heat-resistant photosensitive resin composition having high sensitivity, excellent adhesiveness and heat resistance as a solder resist-plating resist capable of withstanding the temperature of soldering as well as conditions of plating and suitable for use in the preparation of printed circuit boards.

A solder resist or a plating resist is a resist material used in the manufacture of printed circuit boards to protect the printed circuit. Since solder resists are used to provide a permanent resist, they must have excellent properties of heat resistance, adhesiveness, resistance against chemicals, electric insulation and so on. Solder resist materials conventionally used in the prior art include heat-curable melamine-based and epoxy-based materials, and non-solvent type ultraviolet-curable materials which need no heat treatment for curing. Ultraviolet-curable solder resists are used mainly in the manufacture of printed circuit boards in household electric appliances due to their relatively low reliability in adhesiveness. Printed circuit boards in industrial instruments are manufactured mainly by use of heat-curable epoxy-based solder resists. The requirements for plating resists are similar to those for the above described solder resists. Thermosetting epoxy-based resins are used as the plating resist.

These solder resists and plating resists are supplied usually in an ink-like form suitable for screen painting, and a printed circuit board having circuit lines is printed therewith through a screen patterned beforehand. A problem inherent in the screen printing process is the more or less unavoidable displacement of the printed pattern. Thus screen printing process using such a heat-curable solder resist to the manufacture of printed circuit boards for industrial use is increasingly difficult as the density of the printed circuit has increased rapidly in recent years.

Those in the art have eagerly sought in recent years to develop an ultraviolet-curable photosensitive solder resist and plating resist having a high resolving power. Among the various types of the ultraviolet-curable solder resists hitherto proposed, are dry film-type solder resists which are currently available on the market. Though displaying excellent heat resistance, dry film-type solder resists have a problem. When one is laminated to the surface of an already patterned printed circuit board raised and recessed from area to area, every nook and corner cannot always be filled with the resist material leaving air bubbles due to the relatively low adhesiveness of the dry film resist. Such air bubbles located below the dry film resist may expand with heat in the subsequent soldering process to cause so-called blistering. Similar problems attend the use of a dry-film type resist material such as the plating resist.

Further, U.S. Pat. No. 4,390,615 teaches a method of using a photoresist comprising:

(a) an ethylenically unsaturated polymerizable reaction product of a polyepoxide and an ethylenically unsaturated carboxylic acid, which product is solid or semisolid in nature;

(b) an inert inorganic filler, the filler and the reaction product (a) being present in a weight ratio of from 20 to 65 parts of the filler to from 80 to 35 parts of the reaction product;

(c) a photopolymerization initiator for the polymerizable reaction product; and (d) a volatile organic solvent for the polymerizable reaction product.

The photoresist compositions of this type, however, possess insufficient resistance against organic solvents and cannot satisfy the requirements for the solder resist because of their relatively low heat resistance.

SUMMARY OF THE INVENTION

An object of the present invention therefore is to provide a novel photosensitive resin composition suitable for use as an ultraviolet-curable solder resist free from the above described problems and disadvantages associated with prior art compositions. The extensive investigations undertaken by the inventors have led to an unexpected discovery that a photosensitive resin composition having excellent heat resistance, adhesiveness, resistance against chemicals, and electric insulation properties can be obtained when the resinous ingredient thereof is a combination of a diallyl phthalate resin and photopolymerizable esterified resins. The present invention has been completed on the basis of this discovery.

Thus, the photosensitive resin composition provided by the present invention comprises:

(A) a mixture of resins composed of
 (A-1) a diallyl phthalate resin,
 (A-2) a first esterified resin which is a reaction product of a cresol novolac type epoxy resin with an ethylenically unsaturated carboxylic acid in an amount 0.2 to 0.8 mole per mole of the epoxy groups in the cresol novolac type epoxy resin, and
 (A-3) a second esterified resin which is a reaction product of a phenol novolac type epoxy resin and/or a cresol novolac type epoxy resin with an ethylenically unsaturated carboxylic acid in an amount of 0.9 to 1.1 moles per mole of the epoxy groups in the phenol novolac type epoxy resin and/or cresol novolac type epoxy resin;
(B) a photopolymerization initiator; and
(C) a curing agent for the epoxy resins.

DETAILED DESCRIPTION OF THE PREFERRED EMBODIMENTS

As is understood from the above summary of the invention, the most characteristic feature of the invention is its resinous component (A) which is a combination of the three types of resins, the first of which is a diallyl isophthalate resin. Diallyl phthalate resins are well known in the art and include diallyl orthophthalate resins, diallyl isothalate resins and diallyl terephthalate resins. They are used either singly or as a combination of two or more types. Diallyl phthalate resins belong to a class of heat-curable aromatic resins having excellent heat resistance, resistance against chemicals and electric insulation properties.

The second of the resin mixture components in the inventive photosensitive resin composition is a cresol novolac type epoxy resin esterified with an ethylenically unsaturated carboxylic acid. The cresol novolac type epoxy resin can be prepared by the reaction of epichlorohydrin or methyl eipchlorohydrin with a cresol novolac resin which is obtained from cresol and formaldehyde.

Similarly, the phenol novolac type epoxy resin, which is esterified with an ethylenically unsaturated carboxylic acid give another esterified resin which is the third of the resin mixture components in the inventive composition, can be prepared by the reaction of epichlorohydrin or methyl chlorohydrin with a phenol formaldehyde novolac resin obtained from phenol and formaldehyde.

The ethylenically unsaturated-basic acid reacted with the above mentioned epoxy resins is exemplified by acrylic acid, methacrylic acid, crotonic acid, monomethyl maleate, monopropyl maleate, monobutyl maleate, sorbic acid and the like. They can be used either singly or as a combination of two or more types according to need.

The esterification reaction of the above mentioned epoxy resin with the ethylenically unsaturated carboxylic acid should be performed in the presence of an esterification catalyst which may be one of those conventionally used, including secondary and tertiary amines and salts thereof such as diethylamine hydrochloride, diethylamine acetate, triethylamine and the like.

The first esterified resin used in the inventive resin composition, which is obtained by the reaction of a cresol novolac type epoxy resin with an ethylenically unsaturated carboxylic acid in an amount of 0.2 to 0.8 mole per mole of the epoxy groups in the epoxy resin, in the presence of an esterification catalyst, has both the epoxy groups and photopolymerizable groups with ethylenic double bonds so that the resin may be polymerized by both photopolymerization by ultraviolet irradiation and thermal polymerization by heating.

On the other hand, the second esterified resin used in the inventive composition, which is obtained by the reaction of a phenol novolac type epoxy resin and/or cresol novolac type epoxy resin with an ethylenically unsaturated carboxylic acid in an amount of 0.9 to 1.1 moles per mole of the epoxy groups in the epoxy resin or resins, in the presence of an esterification catalyst, is a heat-resistant polyfunctional esterified resin having almost no epoxy groups left unreacted and is mainly polymerizable by irradiation with ultraviolet.

The component (A) of the inventive photosensitive resin composition is a mixture composed of from 25 to 70 parts by weight of the diallyl phthalate resin, from 20 to 60 parts by weight of the first esterified resin and from 10 to 50 parts by weight of the second esterified resin. If the amount of the diallyle phthalate resin were too large, the resin composition would have a somewhat decreased photosensitivity. While if the amount thereof were too small, the heat resistance of the resin composition would be decreased so that the object of the present invention cannot be achieved.

It is optional according to need that the inventive photosensitive resin composition be admixed with a photopolymerizable monomer or oligomer, having at least two ethylenically unsaturated double bonds in a molecule, in an amount not to exceed 20% by weight of the above described resin mixture composed of the three component resins. Addition of such a photopolymerizable monomer or oligomer to the inventive resin composition has the effect to increase the photosensitivity of the composition, but an amount thereof in excess of the above mentioned upper limit is undesirable due to an increase in the tackiness of the photosensitive resin surface.

The above mentioned photopolymerizable monomer or oligomer having at least two ethylenically unsaturated double bonds in a molecule is exemplified by polyacrylates and polymethacrylates of a polyhydric alcohol such as 1,6-hexanediol diacrylate, trimethylolpropane triacrylate, tetramethylolpropane tetraacrylate and dipentaerithritol pentaacrylate. Other examples are acrylic or methacrylic acid adducts of an epoxy resin obtained by the reaction of bisphenol A with epichlorohydrin or methyl epichlorohydrin, acrylic or methacrylic acid adducts of an epoxy resin obtained by the reaction of a halogenated bisphenol A with epichlorohydrin or methyl epichlorohydrin, reaction products of acrylic or methacrylic acid with an epoxy resin obtained by the reaction of bisphenol A or a halogenated bisphenol A with ethylene oxide, polyfunctional urethane acrylates obtained by the reaction of an aliphatic or aromatic urethane compound with acrylic or methacrylic acid and so on.

The component (B) in the inventive photosensitive resin composition is a photopolymerization initiator which can be any of conventionally used initiators including benzophenone compounds, e.g., benzophenone, 4,4'-dimethylaminobenzophenone and 4,4'-diethylaminobenzophenone, anthraquinone compounds (e.g., 2-ethyl anthraquinone and tert-butyl anthranquinone), benzoin alkyl ethers (e.g., benzoin ethyl ether, benzoin isobutyl ether and benzoin isopropyl ether), acetophenone compounds (e.g., 2,2-dimethoxy-2-phenyl acetophenone and 2,2-di-ethoxy acetophenone), xanthone compounds, (e.g., 2-chlorothioxanthone and diethyl thioxanthone) propiophenone compounds (e.g. 2-hydroxy-2-methyl propiophenone and 4'-isopropyl-2-hydroxy-2-methyl propiophenone), and the like. These compounds can be used either singly or in a combination of two or more types according to need. The amount of the photopolymerization initiator as the component (B) in the inventive resin composition should be in the range from 2 to 10% by weight based on the overall amount of the above described three kinds of the resin mixture components (A-1) to (A-3).

While the epoxy resin curing agent of the present invention includes amine compounds, acid anhydride compounds, phenolic resins, melamine resins, cationic curing agents and others, the curing agent for the epoxy resins used in the inventive resin composition as the component (C) should preferably be an amine-based curing agent or a cationic curing agent for epoxy resins. Preferred curing agents for the epoxy resins include imidazole compounds such as 2-ethyl-4-methyl imidazole sold under the trade name of 2E4MZ by Shikoku Kasei Kogyo Co., Ltd., 1-cyanoethyl-2-phenyl imidazole sold under the trade name of 2E4MZ-CN by Shikoku Kasei Kogyo Co., Ltd., 2-phenyl-4,5-dihydroxy methyl imidazole sold under the trade name of 2PHZ by Shikoku Kasei Kogyo Co., Ltd. and a blend of 2-methyl imidazole and triazine sold under the trade name of 2MZ-OK by Shikoku Kasei Kogyo Co., Ltd., tertiary amines such as benzyl dimethyl amine and dimethylaminomethyl phenol, amino complex compounds such as boron trifluoride monoethyl amine and boron trifluoride triethanol amine and a cationic epoxy curing agent producing a Lewis acid by ultraviolet irradiation sold under the trade name of CG-24-61 by Ciba Geigy Co. The amount of the curing agent for epoxy resins in the inventive composition should be in the range from 2 to 10% by weight based on the first esterified resin. When the amount of the curing agent is too small, complete curing of the composition by heating unduly long. When the amount of the curing agent is too large, on the other hand, the photosensitive resin composition of the invention has somewhat decreased storage stability.

It is optional according to need that the inventive resin composition be admixed with a thermal polymerization inhibitor such as hydroquinone, methyl hydroquinone, hydroquinone monomethyl ether and the like to prevent gelation of the composition or to improve the storage stability thereof.

It is also possible that the inventive resin composition be admixed with various types of known additives including coloring agents such as dyes and pigments, thixotropy modifiers such as finely divided fumed silica fillers, silicone-based and fluorocarbon-based defoaming agents, fillers such as mica flakes and talc, adhesiveness improvers and so on.

The photosensitive resin composition of the present invention is normally used as a solution in an organic solvent. Suitable organic solvents used to dissolve the inventive composition include ethylene glycol monoethyl ether, ethylene glycol monoethyl ether acetate, ethylene glycol monobutyl ether, ethylene glycol monobutyl ether acetate, diethylane glycol monoethyl ether, diethyleneglycol monoethyl ether acetate, methyl ethyl ketone, methyl isobutyl ketone, 1,1,1-trichloroethane, trichloroethylene and the like. These organic solvents can be used either singly or as a mixture of two or more types according to need.

The inventive photosensitive resin composition is described in more detail by way of examples. The compositions described are intended to be exemplary and not as limitations upon the scope of the present invention.

EXAMPLE I

Into a separable flask equipped with a thermometer, stirrer and reflux condenser, 2000 g of a cresol novolac type epoxy resin having a softening point of 60° to 70° C. and epoxy equivalent of 200 to 230 (YDCN 701, a product by Tohto Kasei Co., Ltd.) were introduced to give about 10 moles of the epoxy groups, 288 g of acrylic acid to give 4 moles of the carboxyl groups, 0.6 g of methyl hydroquinone and 2.9 g of triethyl amine. The mixture was agitated at 100° C. for 15 hours to effect the esterification reaction. The thus obtained resin, which is referred to as the first esterified resin A hereinbelow, had an acid value of 2 or below.

Separately, another esterified resin, which is referred to as the second esterified resin B hereinbelow, having an acid value of 2 or below was prepared by heating a mixture composed of 1800 g of a phenol novolac type epoxy resin having an epoxy equivalent of 170 to 190 (YDPN 638, a product by Tohto Kasei Co., Ltd.) to give about 10 moles of the carboxyl groups 1.4 g of hydroquinone and 7.2 g of triethyl amine at 100° C. for 15 hours to effect the esterification reaction.

A homogeneous resin solution having a solid content of 71% by weight was then prepared by dissolving 35 parts by weight of the first esterified resin A, 25 parts by weight of the second esterified resin B, 35 parts by weight of a diallyl isophthalate resin (a product by Osaka Soda Co., Ltd.) and 5 parts by weight of trimethylolpropane triacrylate (A-TMOT, a product by Shin-Nakamura Kagaku Co.) in 40 parts by weight of diethyleneglycol monoethyl ether acetate and the solution was further admixed with 3 parts by weight of benzophenone, 0.5 parts by weight of 4,4'-diethylamino benzophenone, 3 parts by weight of 2-phenyl-4,5-dihydroxy methyl imidazole, 5 parts by weight of a fumed silica filler (Aerosil #200, a product by Nippon Aerosil Co.) and 0.8 parts by weight of a silicone defoaming agent followed by milling on a three-roller mill to give an ink suitable for screen printing.

A printed circuit board on which a printed circuit had been formed in advance was coated with the thus prepared ink by transfer through a polyester-made mesh having a fineness of 180 mesh. The coated printed circuit board was dried at 80° C. for 30 minutes and, after cooling to room temperature, irradiated pattern-wise through a negative photomask with ultraviolet light to give a dose of 300 mJ/cm$^2$. The resin composition on the unexposed area was dissolved and removed with 1,1,1-trichloroethane taking 60 seconds to give a printed circuit board provided with a layer of solder resist. This printed circuit board was further subjected to whole-surface exposure to ultraviolet light in a dose of 2 J/cm$^2$ followed by a heat treatment at 140° C. for 60 minutes to fully cure the resin composition layer.

The printed circuit board was immersed for 1 minute in a bath of molten solder alloy at 260° C., but revealed no noticeable discoloration and blistering in the layer of the cured resin layer composition on the circuit. Finally, the printed circuit board was immersed in boiling trichloroethylene for 10 minutes with absolutely no change in the appearance.

EXAMPLE II

An esterified resin having an acid value of 2 or below, which is referred to as the first esterified resin C hereinbelow, was prepared by heating a mixture composed of 2000 parts by weight of a cresol novolac type epoxy resin having an epoxy equivalent of 200 to 230 (YDCN 704, a product by Tohto Kasei Co., Ltd.) to give about 10 moles of the epoxy groups, 504 parts by weight of acrylic acid to give 7 moles of the carboxyl groups, 1 part by weight of methyl hydroquinone, and 6 parts by weight of triethyl amine at 110° C. for 15 hours to effect the esterification reaction.

A homogeneous resin solution was then prepared by dissolving under agitation 30 parts by weight of the thus prepared first esterified resin C, 30 parts by weight of the second esterified resin B prepared in Example 1, 40 parts by weight of the same diallyl isophthalate resin as used in Example 1, 1 part by weight of diethyl thioxanthone (DETX, a product by Nippon Kayaku Co., Ltd.) 5 parts by weight of 2,2-dimethoxy-2-phenyl acetophenone (Irgacure 651, a product by Ciba Geigy Co.) and 3 parts by weight of 1-cyanoethyl-2-phenyl imidazole (2E4MZ-CN, supra) in 60 parts by weight of ethylene glycol monoethyl ether acetate.

A printed circuit board, on which a printed circuit had been formed in advance, was coated with this resin solution by using a roll coater followed by drying at 80° C. for 20 minutes and, after cooling to room temperature, irradiated with ultraviolet light in a dose of 800 mJ/cm$^2$ through a negative photomask. The resin composition on the unexposed areas was dissolved and removed by spray development with 1,1,1-trichloroethane taking 100 seconds. Thereafter, the printed circuit board was subjected to whole-surface exposure to ultraviolet light in a dose of 2 J/cm$^2$ followed by a heat treatment at 150° C. for 60 minutes to cure fully the resin composition layer.

The printed circuit board prepared in this manner was immersed first for 1 minute in a bath of molten solder alloy at 260° C. and then for 5 minutes in boiling trichloroethylene with absolutely no change in the appearance of the cured resin layer, such as blistering and peeling.

EXAMPLE III

A homogeneous resin solution was prepared by thoroughly mixing in a ball mill 40 parts by weight of the first esterified resin C prepared in Example 2, 40 parts by weight of a diallyl orthophthalate resin (a product of Osaka Soda Co., Ltd.), 20 parts by weight of a blend of a cresol novolac type second esterified resin and trimethylolpropane triacrylate (SP-4010, a product by Showa Highpolymer Co., Ltd.), 60 parts of ethylene glycol monoethyl ether acetate, 5 parts by weight of tert-butyl (anthraquinone), 3 parts by weight of benzoin isopropyl ether and 3 parts by weight of 2-phenyl-4,5-dihydroxy methyl imidazole (2PHZ, supra).

A printed circuit board was coated with this resin solution using a roll coater followed by drying at 80° C. for 20 minutes and then, after cooling to room temperature, irradiated with ultraviolet light in a dose of 400 mJ/cm$^2$ through a negative photomask. The resin composition on the unexposed areas was dissolved and removed by application of 1,1,1-trichloroethane, and then the printed circuit board was subjected to whole-surface exposure to ultraviolet light in a dose of 2 J/cm$^2$ followed by a heat treatment at 150° C. for 60 minutes to cure fully the resin composition layer.

The printed circuit board was immersed for 1 minute in a bath of molten solder alloy at 260° C. with absolutely no change in the appearance of the cured resin layer on the circuit board.

EXAMPLE IV

An ink composition for screen printing was prepared by uniformly kneading, in a three-roller mill, a mixture composed of: 10 g of the esterified resin B prepared in Example 1; 50 g of the esterified resin C prepared in Example 2; 40 g of a diallyl isophthalate resin; 5 g of acrylated epoxy resin (A BPE-4, a product by Shin-Nakamura Kagaku Co.); 40 g of ethylene glycol monobutyl ether acetate; 5 g of Irgacure 651; 1 g of diethyl thionanthone; 2 g of dimethylamino bezoic ethyl ester (EPA, a product by Nippon Kayaku Co., Ltd.), 2 g of a blend of 2-methylimidazol and triazine (2MZ-OK, a product by Shikoku Kasei Kogyo Co., Ltd.); 6 g of a silica filler (Aerosil #380) and 1 g of a silicone defoaming agent. The ink composition was transferred to the surface of a copper-clad laminated board through a polyester fiber screen of 180 mesh fineness and dried by heating at 80° C. for 20 minutes followed by cooling to room temperature. The layer of the resist ink prepared in this manner was irradiated with ultraviolet light in a dose of 400 mJ/cm$^2$ through a photomasks bearing a negative pattern, followed by a development treatment with 1,1,1-trichloroethane to remove the ink layer on the unirradiated areas. Thereafter the patterned ink layer on the board was subjected to whole-surface exposure to ultraviolet in a dose of 2 J/cm$^2$, followed by heating at 150° C. for 60 minutes.

The copper-clad board with resist layer patterned in this manner was subjected to plating in a bath for electroless copper plating, having a pH of 12.0 at 70° C. for 12 hours so that a 25 m thick copper plating was obtained. After subsequent thermal curing by heating at 150° C. for 30 minutes, the copper-plated board was dipped in a molten solder alloy at 260° C. for 10 seconds with no damage such as blistering and exfoliation in the resist layer. As is shown by the above experimental results, the resist composition of the present invention can be used as a resist material for electroless copper plating by virtue of the excellent adhesion to the surface of copper and the high resistance against alkalis.

COMPARATIVE EXAMPLE I

A homogeneous ink composition for screen printing was prepared by thoroughly milling on a three-roller mill a mixture composed of 55 parts by weight of the first esterified resin A prepared in Example I, 40 parts by weight of the second esterified resin B prepared in Example I, 5 parts by weight of trimethylolpropane triacrylate, 40 parts by weight of ethylene glycol monobutyl ether, 3 parts by weight of benzophenone, 0.5 parts by weight of 2-phenyl-4,4'-diethylaminobenzophenone, 4 parts by weight of 4,5-dihydroxy methyl imidazole (2 pHz, supra), 5 parts by weight of a fumed silica filler (Aerosil #200, supra) and 1 part by weight of a silicone defoaming agent.

A printed circuit board, on which a printed circuit had been formed in advance, was coated with the ink composition by transfer through a polyester-made mesh of 180 mesh fineness followed by drying at 80° C. for 20 minutes. After cooling to room temperature, this coated printed circuit board was irradiated with ultraviolet light in a dose of 400 mJ/cm$^2$ through a negative photomask. Development of the ultraviolet-irradiated printed circuit board by using 1,1,1-trichloroethane to remove the resin composition on the unexposed area could not be completed, leaving a considerable amount of the resin composition on the circuit lines. Thus, the printed circuit board, after thermal curing of the resin composition by heat, could not be soldered on the proper portions when it was immersed in a bath of molten solder alloy kept at 260° C.

COMPARATIVE EXAMPLE II

A homogeneous ink composition for screen printing was prepared by thoroughly milling on a three-roller mill a mixture composed of 40 parts by weight of the same diallyl isophthalate resin as used in Example I, 40 parts by weight of the second esterified resin B prepared in Example I, 20 parts by weight of a cresol novolac type epoxy resin (YDCN 701, supra), 40 parts by weight of ethylene glycol monoethyl ether acetate, 3 parts by weight of benzophenone, 0.5 part by weight of 4,4'-diethylamino benzophenone, 3 parts by weight of 2-phenyl-4,5-dihydroxy methyl imidazole (2PHZ, supra), 5 parts by weight of a finely divided fumed silica filler (Aerosil #200, supra) and 1 part by weight of a silicone defoaming agent.

A printed circuit board was coated with this ink composition by screen printing followed by drying, and was then subjected to pattern-wise exposure to ultraviolet light in the same manner as in Example I, followed by development using 1,1,1-trichloroethane for 60 minutes to remove the resin composition from the unexposed areas. The resin composition on the exposed areas became swollen with the solvent and fell off the circuit lines on the printed circuit board so that the resist-protected printed circuit board as desired could not be obtained.

COMPARATIVE EXAMPLE III

A homogeneous ink composition for screen printing was prepared by thoroughly milling on a three-roller mill a mixture composed of 40 parts by weight of the same diallyl isophthalate resin as used in Example I, 30 parts by weight of the first esterified resin A prepared in Example I, 30 parts by weight of tetramethylolpropane tetraacrylate (A-TMMT, a product by ShinNakamura Kagaku Co.), 3 parts by weight of benzophenone, 0.5 parts by weight of 4,4'-diethylamino benzophenone, 3 parts by weight of 1-cyanoethyl-2-phenyl imidaole (2E4MZ-CN, supra), 5 parts by weight of a finely divided fumed silica filler (Aerosil #200, supra) and 1 part by weight of a silicon defoaming agent.

A printed circuit board was coated with this ink composition, followed by drying, and was then subjected to pattern-wise exposure to ultraviolet light through a negative photomask in the same manner as in Example I. The ultraviolet exposure, however, could not be performed satisfactorily since the resin composition retained stickiness even after the ultraviolet exposure, and the resin composition on the circuit lines was transferred on to the negative photomask.

COMPARATIVE EXAMPLE IV

An ink composition was prepared according to the Example in U.S. Pat. No. 4,390,615 by admixing 63.5 g of an ink vehicle, which was a solution of 100 parts by weight of an epoxyacrylate resin having a softening point of 60° to 70° C. (SP-4060, a product by Showa High Polymer Co., Ltd.) in 40 parts by weight of ethylene glycol monobutyl ether, with 0.5 g of Phthalocyanin Green as a pigment, 30.0 g of a finely pulverized talc, 5 g of dimethoxyphenyl acetophenone (Irgacure 651, supra) and 1.0 g of a silicone defoaming agent.

A copper-clad through-hole circuit board was coated with the ink composition prepared in this manner over the whole surface through a screen of 100 mesh fineness followed by drying in a drying oven at 80° C. for 30 minutes. The board with the ink layer was overlaid with a positively patterned film as a photomask and irradiated with ultraviolet light in a dose of J/cm² using a super-high pressure mercury lamp of 3 kW output, followed by a development treatment with 1,1,1-trichloroethylene to remove the ink layer on the unirradiated areas. The board with the resist layer patterned in this manner was subjected to the tests for the heat resistance by soldering and resistance against organic solvents making comparison with the resist composition prepared in Example III described above. The resist layer of this comparative example could withstand only two 10 second dips in molten solder alloy at 260° C., while the resist layer according to Example III could withstand five or more such dips without damages in the evaluation of the peeling test with a pressure-sensitive adhesive tape. The solder-dipping test was performed using a flux Lonco 5533-11.

The resist layer of this comparative example was swollen after 1 minute in boiling methylene chloride or ethylene glycol monoethyl ether, while the resist layer according to Example III would withstand 10 minutes and 5 minutes dipping in boiling methylene chloride and ethylene glycol monoethyl ether, respectively, with no noticeable change in its appearance.

What is claimed is:
1. A heat-resistant photosensitive resin composition which comprises:
   (A) a mixture of resins composed of
      (A-1) a diallyl phthalate resin,
      (A-2) a first esterified resin which is a reaction product of a cresol novolac epoxy resin with an ethylenically unsaturated carboxylic acid in an amount of 0.2 to 0.8 mole per mole of the epoxy groups in the cresol novolac epoxy resin, and
      (A-3) a second esterified resin which is a reaction product of a phenol novolac epoxy resin, a cresol novolac epoxy resin or a combination thereof, with an ethylenically unsaturated carboxylic acid in an amount of 0.9 to 1.1 moles per mole of the epoxy groups in the epoxy resin or resins;
   (B) a photopolymerization initiator; and
   (C) a curing agent for the epoxy resins.
2. The heat-resistant photosensitive resin composition of claim 1, wherein the amount of the photopolymerization initiator as the component (B) is in the range from 2 to 10% by weight based on the resin mixture as the component (A).
3. The heat-resistant photosensitive resin composition of claim 1, wherein the amount of the curing agent as the component (C) is in the range from 2 to 10% by weight based on the first esterified resin as the component (A-2).
4. The heat-resistant photosensitive resin composition of claim 1, wherein the resin mixture as the component (A) is composed of from 25 to 70 parts by weight of the diallyl phthalate resin as the component (A-1), from 20 to 60 parts by weight of the first esterified resin as the component (A-2) and from 10 to 50 parts by weight of the second esterified resin as the component (A-3).
5. The heat-resistant photosensitive resin composition of claim 1, wherein the ethylenically unsaturated carboxylic acid is selected from the group consisting of acrylic acid, methacrylic acid, crotonic acid, monomethyl maleate, monopropyl maleate, monobutyl maleate and sorbic acid.
6. The heat-resistant photosensitive resin composition of claim 1, which further comprises a photopolymerizable monomer or oligomer having at least two ethylenically unsaturated double bonds in a molecule in an amount up to 20% by weight based on the resin mixture as the component (A).
7. The heat-resistant photosensitive resin composition of claim 1, wherein the photopolymerization initiator as the component (B) is selected from the group consisting of benzophenone compounds, anthraquinone compounds, benzoin alkyl ethers, acetophenone compounds, xanthone compounds and propiophenone compounds.
8. The heat-resistant photosensitive resin composition of claim 1, wherein the curing agent for the epoxy resins as the component (C) is selected from the group consisting of amine compounds, acid anhydride compounds, phenolic resins, melamine resins and cationic epoxy curing agents.

* * * * *